United States Patent [19]

Jen

[11] Patent Number: 5,672,242
[45] Date of Patent: Sep. 30, 1997

[54] HIGH SELECTIVITY NITRIDE TO OXIDE ETCH PROCESS

[75] Inventor: Jang Jen, San Jose, Calif.

[73] Assignee: Integrated Device Technology, Inc., Santa Clara, Calif.

[21] Appl. No.: 594,930

[22] Filed: Jan. 31, 1996

[51] Int. Cl.$^6$ .................................. H01L 21/3105
[52] U.S. Cl. .................. 156/662.1; 156/643.1; 156/657.1; 156/653.1
[58] Field of Search ................ 156/643.1, 657.1, 156/659.11, 662.1, 653.1

[56] References Cited

U.S. PATENT DOCUMENTS

| | | | |
|---|---|---|---|
| 4,214,946 | 7/1980 | Forget et al. | 156/643.1 |
| 4,484,979 | 11/1984 | Stocker | 156/659.11 |
| 4,538,343 | 9/1985 | Pollack et al. | 156/643.1 |
| 4,595,484 | 6/1986 | Giammarco et al. | 204/192.35 |
| 4,836,887 | 6/1989 | Daubenspeck et al. | 216/75 |
| 4,966,870 | 10/1990 | Barber et al. | 437/240 |
| 4,978,420 | 12/1990 | Bach | 156/659.11 |
| 5,017,999 | 5/1991 | Roisen et al. | 357/49 |
| 5,086,011 | 2/1992 | Shiota | 156/657.1 |
| 5,147,500 | 9/1992 | Tachi et al. | 216/79 |
| 5,356,515 | 10/1994 | Tahara et al. | 156/643.1 |
| 5,371,035 | 12/1994 | Pfiester et al. | 437/69 |
| 5,431,772 | 7/1995 | Babie et al. | 156/643.1 |
| 5,468,342 | 11/1995 | Nulty et al. | 216/75 |
| 5,573,597 | 11/1996 | Lantsman | 156/643.1 |
| 5,605,637 | 2/1997 | Shan et al. | 216/71 |
| 5,611,888 | 3/1997 | Bosch et al. | 156/643.1 |

OTHER PUBLICATIONS

"Plasma Etch: A Matter of Fine–Tuning", *Semiconductor International*, Dec. 1995.

*Primary Examiner*—R. Bruce Breneman
*Assistant Examiner*—Anita Alanko
*Attorney, Agent, or Firm*—Skjerven, Morrill, MacPherson, Franklin & Friel

[57] ABSTRACT

The process parameters according to which the AMT 8310 RIE plasma etcher operates are altered so as to increase the nitride to oxide selectivity of the AMT 8310 RIE plasma etcher from approximately 3:1 to approximately 5:1, thereby allowing for the fabrication of modern semiconductor devices having oxide films significantly less thick than 325 Å. In this manner, the present invention eliminates the need for an expensive upgrade in etching equipment to realize an increase in nitride to oxide selectivity. The semiconductor device is electrically biased at 100–300 volts, and freon and oxygen have a flow rate ratio of approximately 1:1.

5 Claims, 1 Drawing Sheet

HIGH SELECTIVITY NITRIDE TO OXIDE ETCH PROCESS

BACKGROUND

1. Field of the Invention

The present invention relates generally to plasma etching techniques and specifically to a plasma etching process having an increased etching selectivity between films.

2. Description of Related Art

In a typical process for the fabrication of an integrated circuit, as shown in FIGS. 1 and 2, a layer 12 of oxide is first formed on the top surface of a silicon wafer 10. Oxide layer 12, which may be used to stop the etching of a subsequently formed nitride layer and thereby protects wafer 10 from damage caused by etchant used in the subsequent formation of integrated circuits on wafer 10, is approximately 325 Å thick. A nitride layer 14 approximately 1500 Å is then formed over oxide layer 12. A layer of photo-resist 16 is then spun on the top surface of nitride layer 14.

After photo-resist layer 16 is patterned using conventional techniques, as shown in FIG. 1, portions of nitride layer 14 exposed by the patterned photoresist layer 16 are removed using a plasma etching machine. One such machine is the AMT 8310 Reactive Ion Etchant (RIE) Plasma etcher available from Applied Materials, as shown in FIG. 2. The standard AMT 8310 etching process has a nitride-to-oxide selectivity of approximately 3:1, i.e., when using the AMT 8310 process, nitride layer 14 is etched at approximately 3 times the rate at which oxide layer 12 is etched. The standard process parameters used with the AMT 8310 are listed below in Table 1.

TABLE 1

| parameter | value |
| --- | --- |
| pressure | 50 mTorr |
| power | 1800 Watts |
| electrical bias | 550 Volts |
| Freon 23 | 90 SCCM |
| Oxygen | 60 SCCM |

It is important when etching away nitride layer 14 that a minimal amount of oxide layer 12 is removed. Should a sufficient portion of oxide layer 12 be inadvertently etched away during removal of nitride layer 14, devices (not shown) subsequently formed within wafer 10 may suffer from punch-through, leakages, and/or well known other reliability problems.

As integrated circuits become smaller, the films used therein have become thinner and thinner. Recent semiconductor devices utilize oxide layers of only approximately 150–200 Å thick. As a result of using such thinner oxide films, RIE plasma etchers including the AMT 8310 described above are not able to effectively remove all of the exposed portions of nitride layer 14 with a sufficiently precise over-etch to compensate for variations in the etchant rate and in the thickness of nitride layer 14 without also completely removing underlying portions of oxide layer 12. Accordingly, the reduction in thickness of oxide layer 12 from approximately 325 Å to approximately 150–200 Å requires a corresponding increase in selectivity of the plasma etcher in order to avoid inadvertently removing the oxide film 12.

SUMMARY

An etching process for use with plasma etchers including the AMT 8310 RIE plasma etcher is disclosed herein which allows for a nitride to oxide selectivity of approximately 5:1. In accordance with the present invention, the process parameters are altered so as to result in the AMT 8310 RIE plasma etcher having a nitride to oxide selectivity of approximately 5:1, thereby allowing the AMT 8310 RIE plasma etcher to be used in the fabrication of advanced semiconductor devices having oxide films significantly less thick than 325 Å. Thus, the present invention eliminates the need for an expensive upgrade in etching equipment.

DETAILED DESCRIPTION

Figure 1:
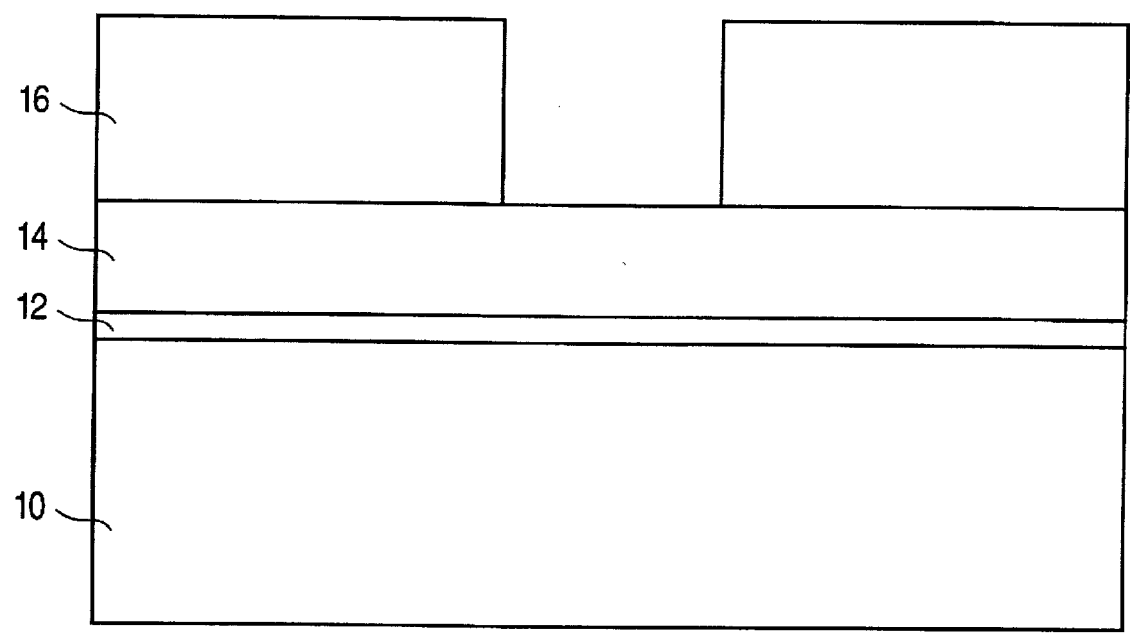
FIGS. 1 and 2 illustrate early process steps in the fabrication of an integrated circuit.
Figure 2:
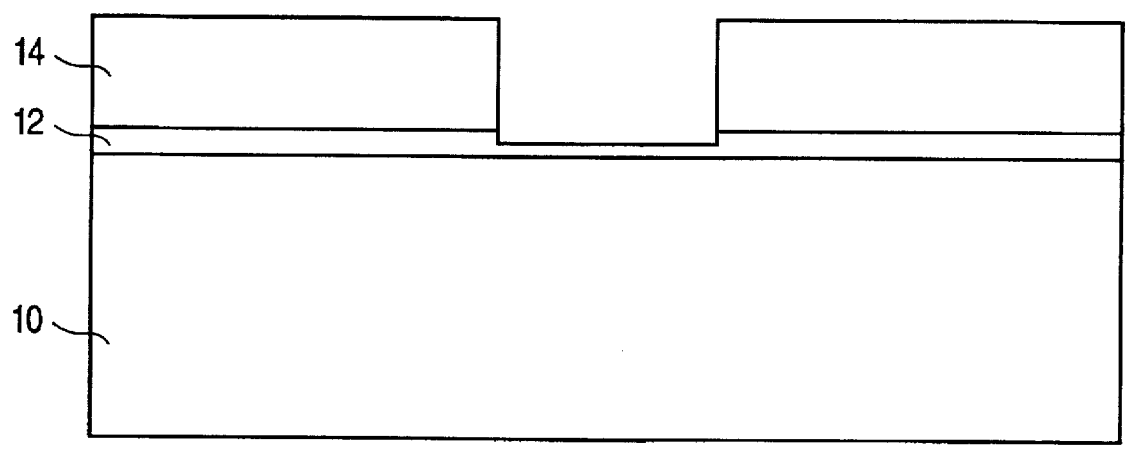

As mentioned above, the use of thinner oxide films in the fabrication of modern semiconductor devices has resulted in a need for higher selectivities when etching away nitride layer 14. When oxide layer 12 is of a thickness on the order of 300 Å, a 3:1 nitride to oxide selectivity is acceptable. Note, however, that as the thickness of oxide layer 12 is reduced to 200 Å and below, error tolerances become much tighter. Indeed, etching away nitride layer 14 using an AMT 8310 plasma etcher having a selectivity of 3:1 is likely to undesirably result in the complete removal of oxide layer 12 underlying exposed portions of nitride layer 14.

Applicant has found that the selectivity of the AMT 8310 RIE plasma etcher may be improved from less than 3:1 to greater than 5:1 by manipulating the process parameters. Using the AMT 8310 in accordance with the process parameters listed above in Table 1 results in nitride layer 14 being etched at approximately 700 Å/min and oxide layer 12 being etched at approximately 250 Å/min.

In accordance with the present invention, the AMT 8310 RIE plasma etcher is operated using the process parameters listed below in Table 2. When operating within these ranges, the AMT 8310 etches away nitride layer 14 at a rate of approximately 200 Å/min and etches away oxide layer 12 at a rate of approximately 40 Å/min, thereby achieving a nitride to oxide selectivity of approximately 5:1. After etching away nitride layer 14 as described above, an over-etch step may be required to compensate for non-uniformities in nitride layer 14.

This increased selectivity allows the AMT 8310 to be used in the fabrication of advanced semiconductor devices having oxide film thicknesses less than 200 Å. Note that since the increased selectivity yielded by the present invention is realized by reducing the etching rate of the AMT 8310 etcher, operating the AMT 8310 in accordance with the present invention results in a 10–20% decrease in throughput as compared to operating the AMT 8310 in accordance with the process parameters listed in Table 1.

TABLE 2

| parameter | value |
| --- | --- |
| pressure | 40–60 mTorr |
| power | 600–1200 Watts |
| electrical bias | 100–300 Volts |
| Freon | 70–100 SCCM |
| Oxygen | 60–90 SCCM |

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

What is claimed is:

1. A method for etching away portions of a nitride layer without significantly etching away an underlying oxide layer in a semiconductor device, said method comprising the steps of:

electrically biasing said semiconductor device at between approximately 100 and 300 volts; and providing Freon and Oxygen gases at first and second flow rates, respectively, wherein said flow rates are approximately 1:1, over a top surface of said nitride layer to remove said nitride layer at a rate of approximately 200 Å/min and to remove said oxide layer at a rate of approximately 40 Å/min.

2. The method of claim 1 wherein said gases are provided over said top surface of said nitride layer at a pressure of approximately 40–60 mTorr.

3. The method of claim 1 wherein said first flow rate is approximately 70–100 SCCM.

4. The method of claim 1 wherein said second flow rate is approximately 60–90 SCCM.

5. The method of claim 1 wherein said gases are provided over said top surface of said nitride layer using a plasma etcher, said plasma etcher being operated at approximately 600–1200 Watts.

* * * * *